(12) United States Patent
Hung et al.

(10) Patent No.: US 7,907,397 B2
(45) Date of Patent: Mar. 15, 2011

(54) HEAT DISSIPATING HINGE FOR PORTABLE ELECTRONIC DEVICE

(75) Inventors: Jui-Wen Hung, Taipei Hsien (TW); Ching-Bai Hwang, Taipei Hsien (TW)

(73) Assignee: Foxconn Technology Co., Ltd., Tucheng, Taipei County (TW)

( * ) Notice: Subject to any disclaimer, the term of this patent is extended or adjusted under 35 U.S.C. 154(b) by 15 days.

(21) Appl. No.: 12/396,483

(22) Filed: Mar. 3, 2009

(65) Prior Publication Data

US 2010/0091450 A1 Apr. 15, 2010

(30) Foreign Application Priority Data

Oct. 14, 2008 (CN) .......................... 2008 1 0304919

(51) Int. Cl.
*G06F 1/20* (2006.01)
*H05K 7/20* (2006.01)

(52) U.S. Cl. ......... 361/679.52; 361/679.27; 361/679.54; 361/679.55; 361/700; 361/704; 165/104.33; 165/185; 174/15.2

(58) Field of Classification Search .......... 361/679.27–679.29, 679.52, 679.55, 361/699–700, 704; 165/80.2–80.5, 104.33, 165/185; 174/15.2; 439/31, 165, 596; 455/575.3
See application file for complete search history.

(56) References Cited

U.S. PATENT DOCUMENTS

| 5,646,822 | A  | * | 7/1997  | Bhatia et al. ............. 361/679.27 |
| 5,718,282 | A  | * | 2/1998  | Bhatia et al. .................... 165/86 |
| 5,832,987 | A  | * | 11/1998 | Lowry et al. .................... 165/86 |
| 5,975,195 | A  | * | 11/1999 | Lowry et al. .................... 165/86 |
| 5,983,995 | A  | * | 11/1999 | Shutou et al. ............ 165/104.33 |
| 6,097,596 | A  | * | 8/2000  | Cipolla et al. ........... 361/679.52 |
| 6,288,896 | B1 | * | 9/2001  | Hsu ......................... 361/679.54 |
| 6,377,452 | B1 | * | 4/2002  | Sasaki et al. ............. 361/679.47 |
| 6,493,226 | B1 | * | 12/2002 | Noguchi et al. ............... 361/700 |
| 6,507,488 | B1 | * | 1/2003  | Cipolla et al. ........... 361/679.52 |
| 6,507,490 | B2 | * | 1/2003  | Sasaki et al. ............. 361/679.47 |
| 6,575,501 | B1 | * | 6/2003  | Loy, Jr. ........................ 285/342 |
| 6,771,498 | B2 | * | 8/2004  | Wang et al. .............. 361/679.47 |
| 7,106,588 | B2 | * | 9/2006  | Oberlin et al. ................ 361/700 |
| 7,116,552 | B2 | * | 10/2006 | Wu ........................... 361/679.26 |
| 7,656,665 | B2 | * | 2/2010  | Lin et al. ....................... 361/700 |

\* cited by examiner

*Primary Examiner* — Robert J Hoffberg
(74) *Attorney, Agent, or Firm* — Frank R. Niranjan (57) ABSTRACT

A portable electronic device includes a housing receiving a heat generating electrical component therein, a display unit and a heat dissipating hinge pivotably interconnecting the housing and the display unit. The heat dissipating hinge includes a body, a cover, a first heat pipe and a second heat pipe. A body defines a first receiving groove receiving a condenser section of the second heat pipe therein. The cover and the body cooperatively define a receiving channel receiving the evaporator section of the first heat pipe therein. Heat generated by the electric device is transferred from the heat generating electronic component to the display unit through the heat dissipating hinge. First and second supporting members are secured to two ends of the evaporator section of the first heat pipe to prevent leakage of thermal grease from a middle portion of the receiving channel.

10 Claims, 7 Drawing Sheets

FIG. 7 ured HEAT DISSIPATING HINGE FOR PORTABLE
ELECTRONIC DEVICE

BACKGROUND

1. Technical Field

The disclosure relates to a heat dissipating device for use in an electronic apparatus, and more specifically to a heat dissipating hinge for use in a portable electronic device.

2. Description of Related Art

A typical portable electronic device such as a notebook computer includes a central processing unit (CPU) housing and a display unit pivotally secured to the CPU housing. During operation of the notebook computer, a CPU disposed in the CPU housing generates heat. Generally, the heat generated by the CPU is removed from the CPU housing through natural radiation or forced air circulation within the CPU housing. With improvement of technology, the CPU operates more quickly and generates more heat. The previous heat-dissipating method cannot efficiently dissipate the heat generated by the CPU.

Therefore, a heat dissipating hinge is desired to overcome the above describe shortcomings.

DETAILED DESCRIPTION OF THE EMBODIMENT

Figure 1:
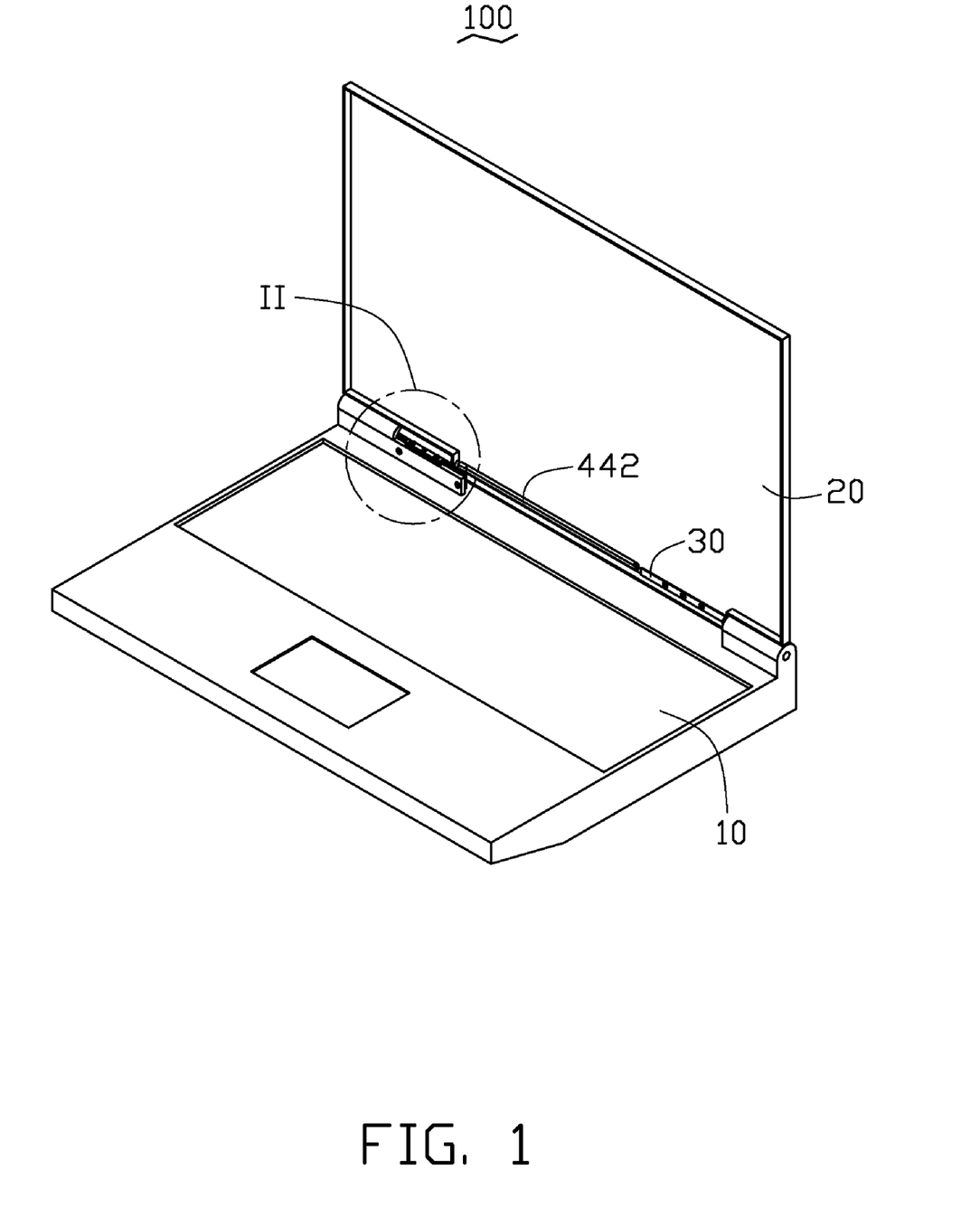
FIG. 1 is a schematic view of a portable electronic device, according to an exemplary embodiment.
Figure 2:
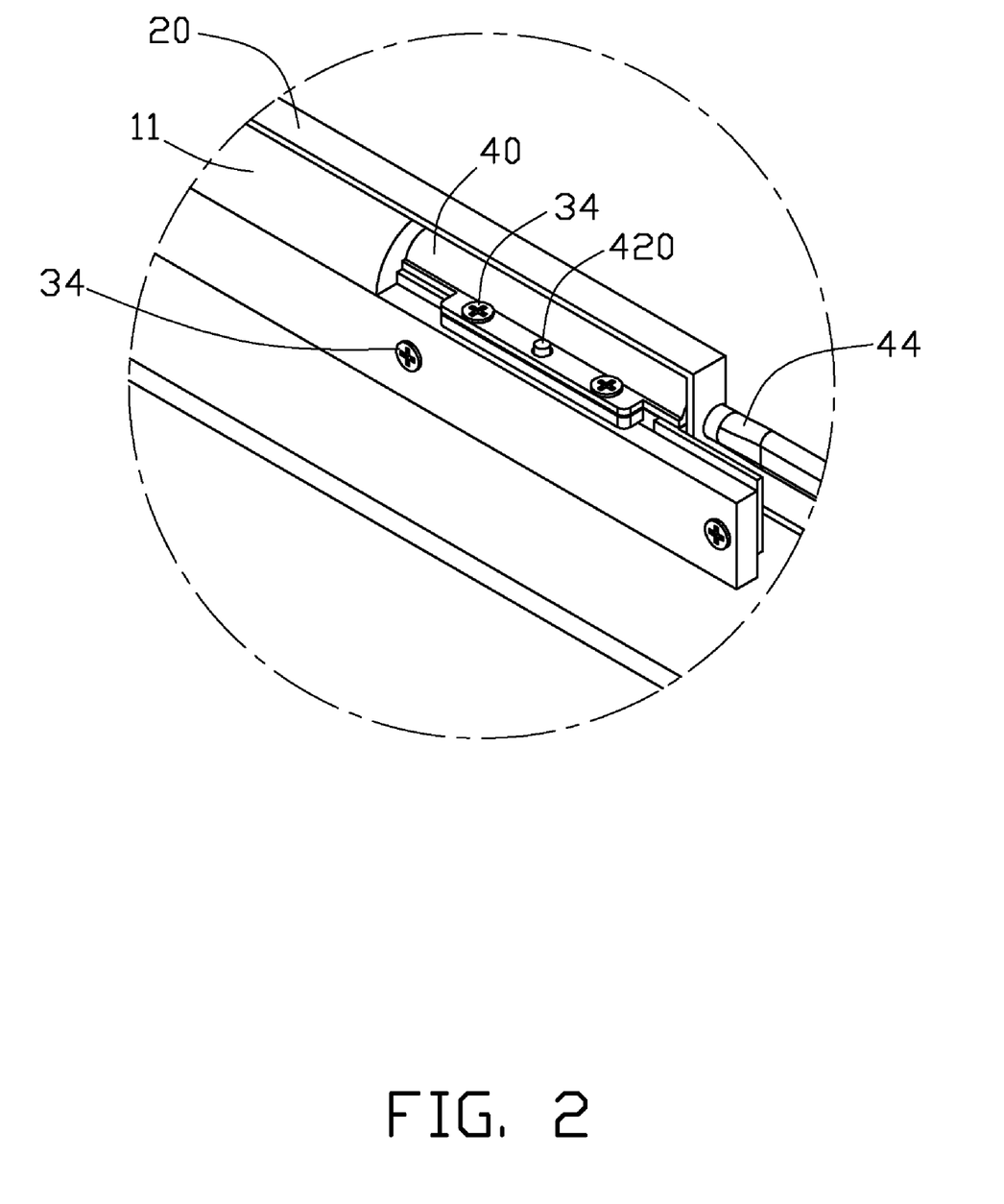
FIG. 2 is an enlarged view of a circle portion II of FIG. 1.
Figure 3:
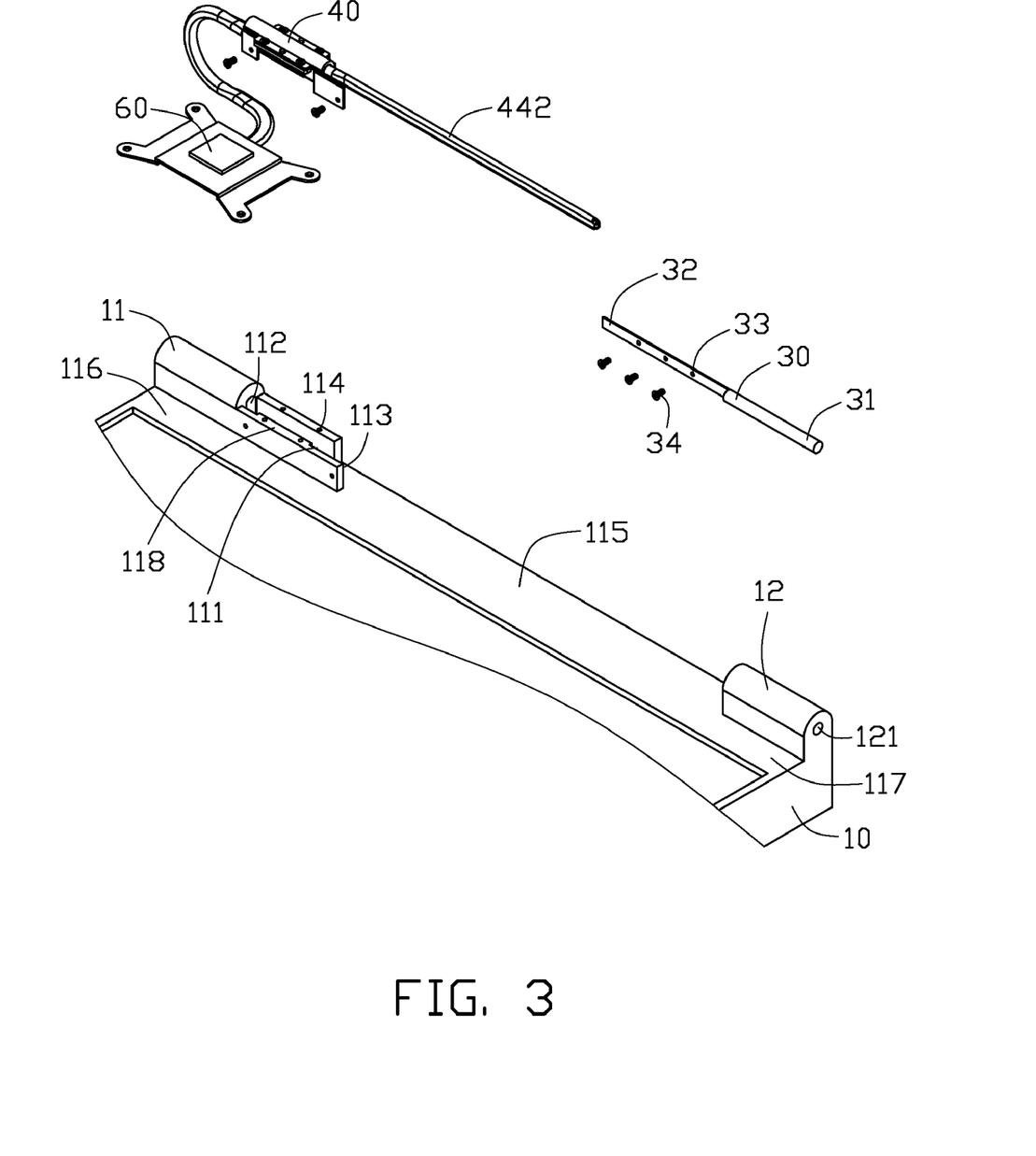
FIG. 3 is an enlarged, exploded view of related components of the portable electronic device of FIG. 1, with a display unit thereof removed.

Referring to FIGS. 1-3, a portable electronic device 100 includes a housing 10 receiving a heat-generating electrical component 60, such as a CPU therein, a display unit 20, a pivot 30, and a heat dissipating hinge 40. The portable electronic device 100 may be a notebook computer or a digital video disk player. The pivot 30 and the heat dissipating hinge 40 pivotably interconnect the housing 10 and the display unit 20 so that the housing 10 and the display unit 20 can have a pivotal movement relative to one another. A first mounting seat 11 and a second mounting seat 12 protrude upwardly from two opposite ends 116, 117 of a rear side 115 of the housing 10, respectively. The first mounting seat 11 defines a receiving groove 111 for receiving the heat dissipating hinge 40. A plurality of first mounting holes 114 are defined in a top surface 118 of the first mounting seat 11 for fixing the heat dissipating hinge 40 to the first mounting seat 11. A receiving hole 121 is defined in the second mounting seat 12 for receiving the pivot 30. The pivot 30 includes a shaft 31 and a rectangle-shaped mounting portion 32 protruding from one end of the shaft 31 toward the heat dissipating hinge 40. The shaft 31 is pivotally received in the receiving hole 121 of the second mounting seat 12. A plurality of second mounting holes 33 are defined in the mounting portion 32. A plurality of screws 34 extend through the second mounting holes 33 respectively to fix the pivot 30 to the display unit 20.

Referring to FIGS. 4-7, the heat dissipating hinge 40 includes a main body 41, a cover 43, a bottom plate 50, a first supporting member 45, a second supporting member 46, a first heat pipe 44 and a second heat pipe 49. The main body 41 has a high thermal conductivity. A first receiving portion 411 and a second receiving portion 414 are formed on a top side 417 and a bottom side 421 of the main body 41, respectively. A semi-circular first receiving groove 413 is defined in the first receiving portion 411. The first receiving groove 413 includes a middle section 4133 and two end sections 4131, 4132 located at two opposite sides of the middle section 4133. The two opposite end sections 4131, 4132 each have a diameter greater than that of the middle section 4133. Accordingly, a step 412 is formed at a joint of each of the two end sections 4131, 4132 and the middle section 4133. Thermal grease is filled in the middle section 4133 of the first receiving groove 413. Two flanges 425 extend laterally and outwardly from front and rear sides of the first receiving portion 411, respectively. Two third mounting holes 426 are defined in a left side and a right side of each flange 425, respectively. A positioning pole 420 is formed on a top surface of each flange 425 and located between the two third mounting holes 426. A second receiving groove 415 is defined in the second receiving portion 414. The second receiving groove 415 is substantially rectangular. A front sidewall 418 of the main body 41 forms a first mounting plate 422 and a second mounting plate 423 at left and right ends thereof, respectively. The first mounting plate 422 and the second mounting plate 423 each define a fourth mounting hole 424. A plurality of screws 34 extend through the fourth mounting holes 424 and fix the main body 41 to the housing 10.

Figure 4:
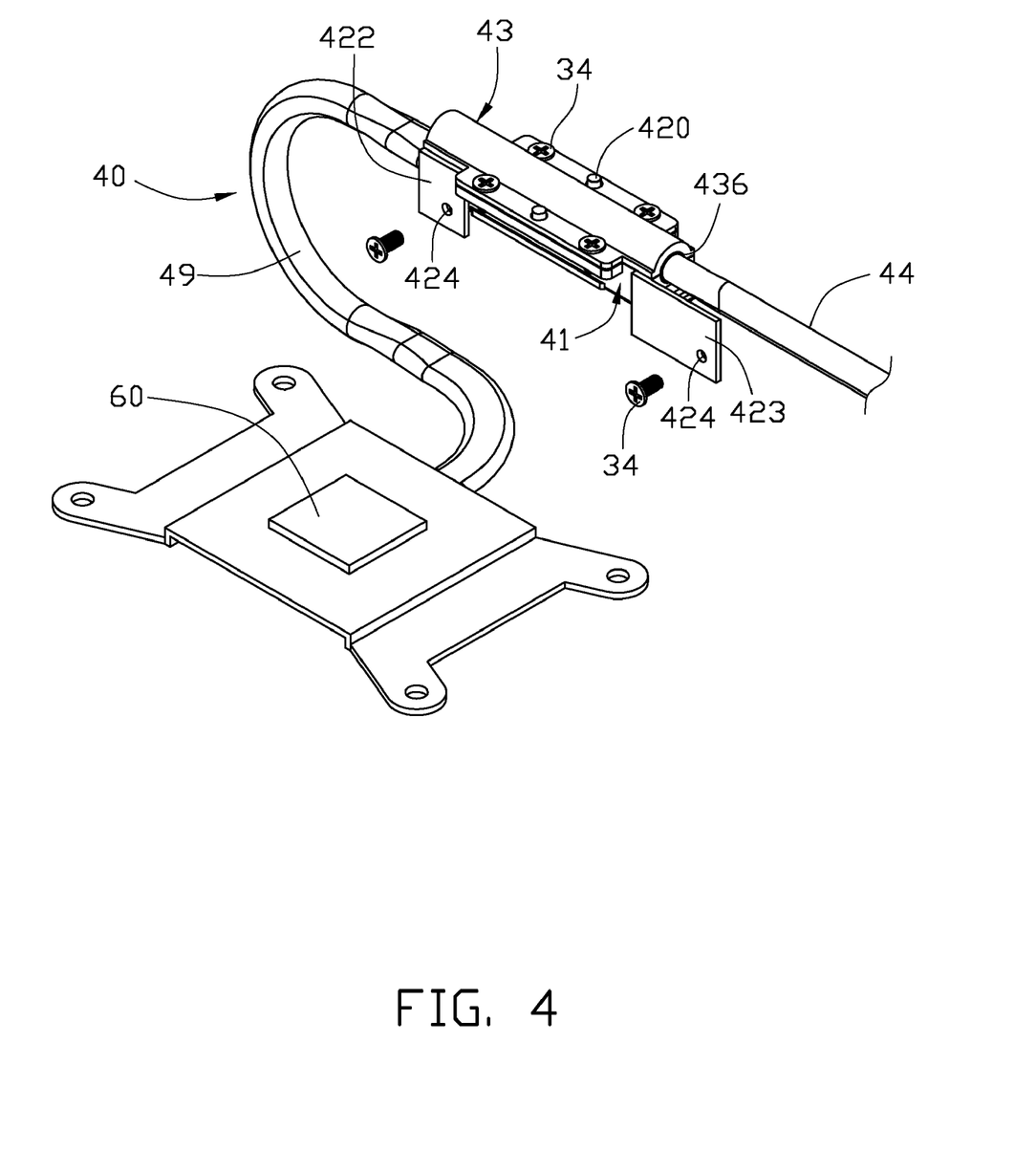
FIG. 4 is an enlarged, schematic view of a heat dissipating hinge of the portable electronic device in FIG. 3, connecting with a heat-generating electrical component.
Figure 5:
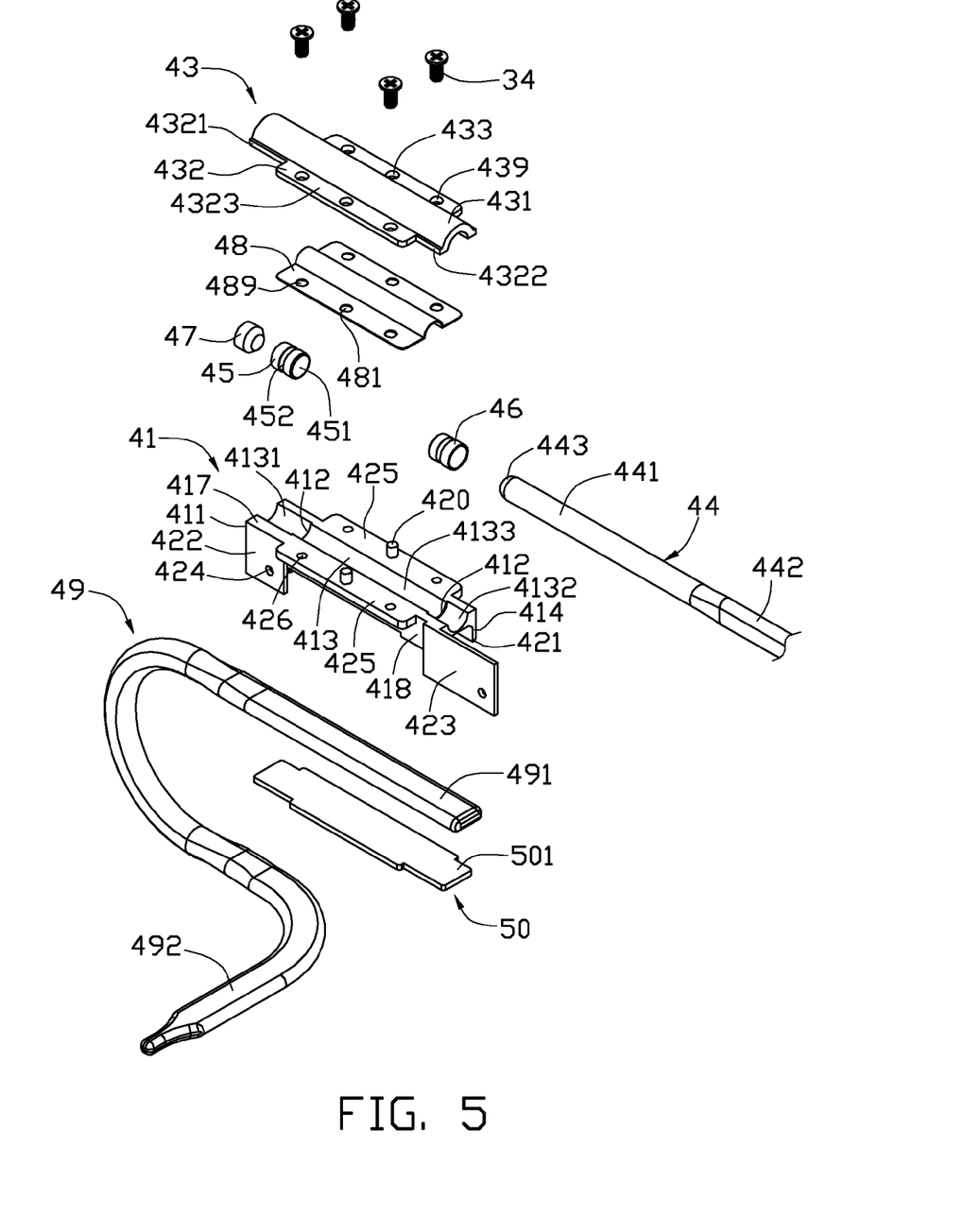
FIG. 5 is an exploded view of the heat dissipating hinge of FIG. 4.
Figure 6:
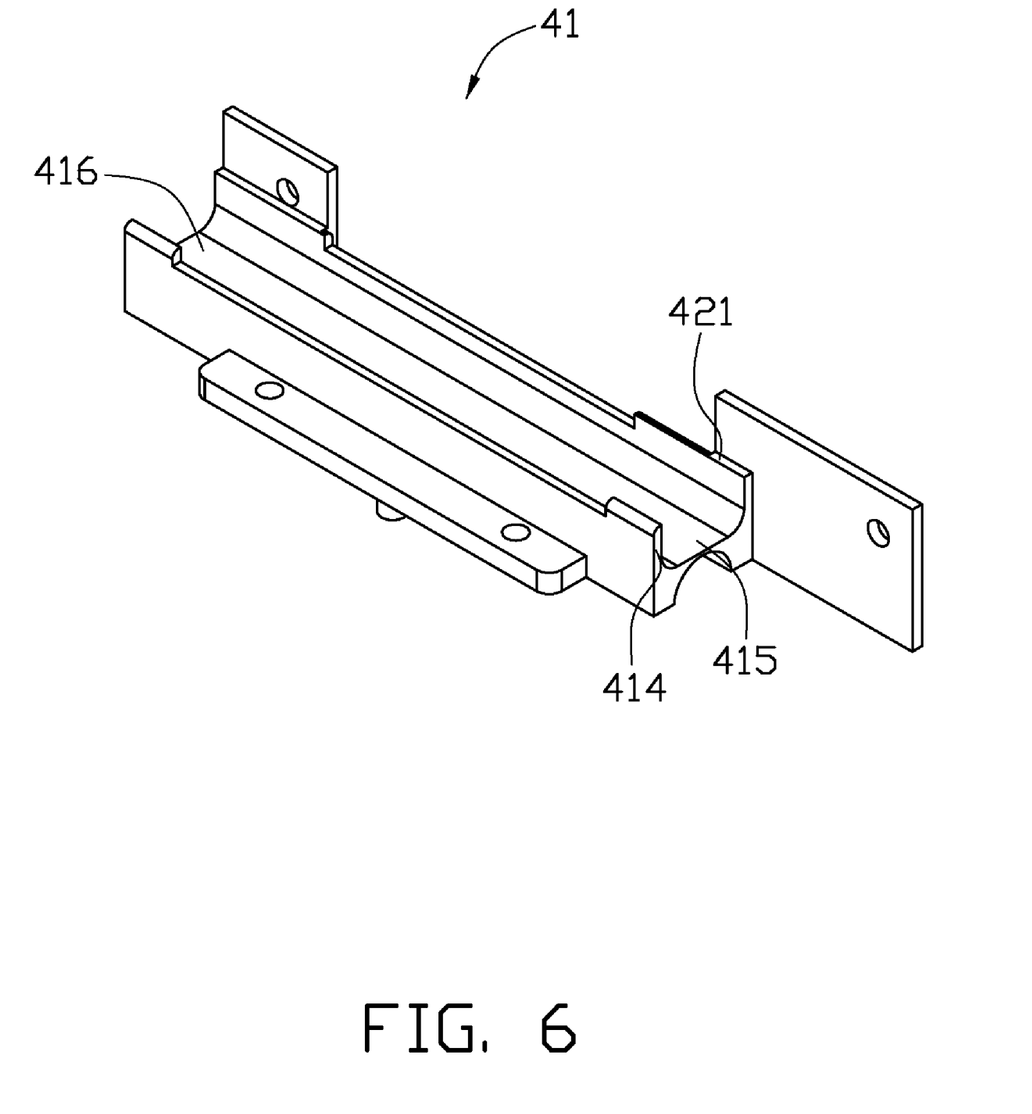
FIG. 6 is an isometric view of a body of the heat dissipating hinge in FIG. 5, but viewed from a bottom side thereof.
Figure 7:
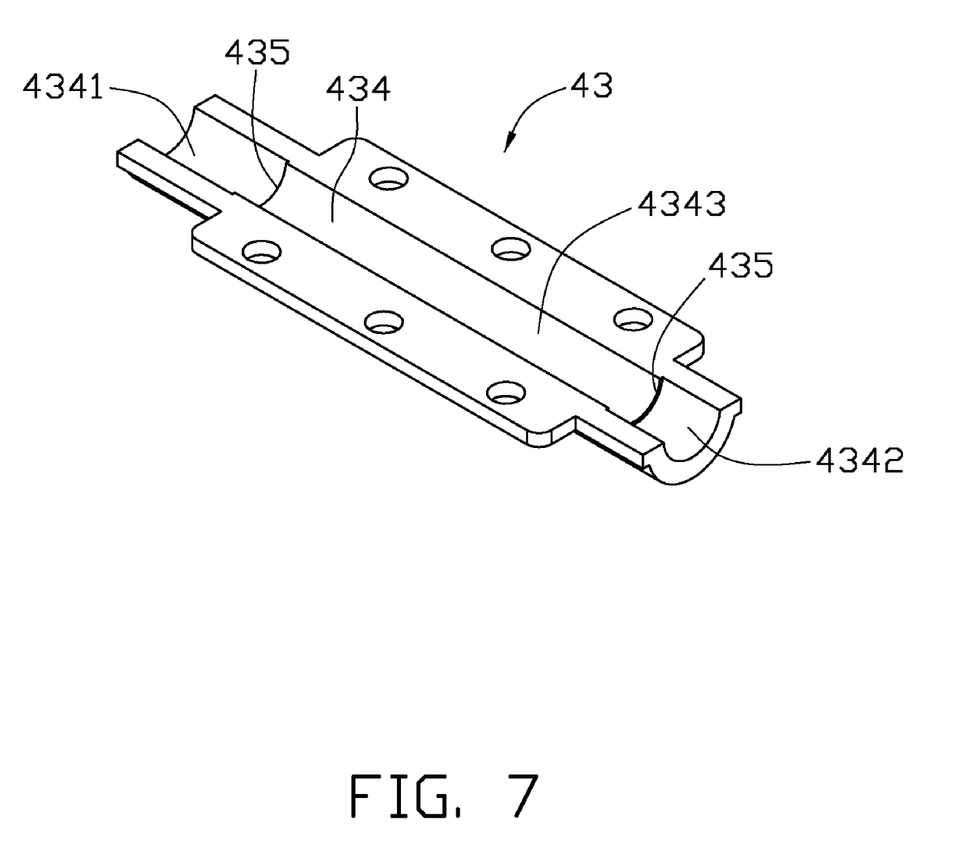
FIG. 7 is an isometric view of a cover of the heat dissipating hinge in FIG. 5, but viewed from a bottom side thereof.

Referring to FIGS. 4-6, the cover 43 includes a semicircular pressing portion 431 and two flanges 432. The two flanges 432 extend outwardly and horizontally from front and rear sides of the pressing portion 431, respectively. Each flange 432 includes a middle section 4323 and two end sections 4321, 4322 at two opposite ends of the middle section 4323. The middle section 4323 of each flange 432 has a width greater than that of each of the two end sections 4321, 4322. Each flange 432 defines two fifth mounting holes 439 corresponding to the two third mounting holes 426 of the flange 425 of the main body 41. A positioning hole 433 is defined in a middle of each flange 432 and corresponds to the positioning pole 420. A third semi-circular receiving groove 434 is defined in a bottom of the pressing portion 431. The third receiving groove 434 includes a middle section 4343 corresponding to the middle section 4133 of the first receiving groove 413 and two end sections 4341, 4342 at two opposite ends of the middle section 4343 and corresponding to the end sections 4131, 4132 of the first receiving groove 413. The middle section 4343 of the third receiving groove 434 of the pressing portion 431 has a diameter smaller than that of each of the two end sections 4341, 4342. Accordingly, a step 435 is formed at a joint of each of the two end sections 4341, 4342 and the middle section 4343. The cover 43 is mounted to the main body 41 and the two flanges 432 are attached to the flanges 425 of the main body 41. The third receiving groove 434 of the cover 43 and the first receiving groove 413 cooperatively define a circular receiving channel 436 (shown in FIG. 4). The receiving channel 436 includes a middle portion corresponding to the middle sections 4133, 4343, and two end portions corresponding to the end sections 4131, 4341 and the end sections 4132, 4342, respectively. Each of the two end portions of the receiving channel 436 has a diameter greater than that of the middle portion of the receiving channel 436.

The first heat pipe 44 includes a circular evaporator section 441 at one end thereof and a flat condenser section 442 at the other end thereof. The condenser section 442 of the first heat pipe 44 is thermally connected to the display unit 20 so that heat absorbed by the first heat pipe 44 can be released to the display unit 20. The evaporator section 441 of the first heat pipe 44 extends through the first supporting member 45 and the second supporting member 46. The first supporting member 45 and the second supporting member 46 are located at two ends of the evaporator section 441 of the first heat pipe 44, respectively. The first and second supporting members 45, 46 are secured to the evaporator section 441 of the first heat pipe 44 by soldering. The first supporting member 45 is cylindrical and has an outer diameter the same as a bore diameter of each of the two end portions of the receiving channel 436. A through hole 451 is defined in the first supporting member 45 and has a bore diameter the same as an outer diameter of the evaporator section 441 of the first heat pipe 44. The evaporator section 441 of the first heat pipe 44 fittingly extends through the through hole 451 and is soldered to the first supporting member 45. An annular groove 452 is defined in an outer circumference of the first supporting member 45 for accommodating the thermal grease leaked from the receiving channel 436, thereby preventing the thermal grease from totally leaking from the receiving channel 436. The second supporting member 46 has a same structure as the first supporting member 45. The thermal grease leaked from the receiving channel 436 is received in the annular groove 452 of the first supporting member 45 and a similar annular groove (not labeled) of the second supporting member 46. The evaporator section 441 of the first heat pipe 44 has a diameter the same as or slightly smaller than the middle portion of the receiving channel 436. The evaporator section 441 of the first heat pipe 44 is rotatably received in the middle portion of the receiving channel 436. The first supporting member 45 and the second supporting member 46 are respectively received in the two end portions of the receiving channel 436. A sealing member 47 made of rubber is received in the receiving channel 436 and adjoins a free end 443 of the evaporator section 441 of the first heat pipe 44, thereby further preventing the thermal grease from leakage. A pad 48 is disposed between the cover 43 and the main body 41 for intimately engaging with an upper half of the evaporator section 441 of the first heat pipe 44, whereby a depressing force exerted by the cover 43 can be more uniformly transmitted to the evaporator section 441 of the first heat pipe 44 to enable a lower half of the evaporator section 441 to have an intimate contact with the main body 41. In addition, the pad 48 achieves a tight connection between the cover 43 and the main body 41. Two positioning holes 481 corresponding to the positioning poles 420 are defined in the pad 48. Four sixth mounting holes 489 are separately defined in four corners of the pad 48, respectively.

The second heat pipe 49 is flat and has a curved shape. The second heat pipe 49 includes an evaporator section 492 at one end and a condenser section 491 at the other end. The condenser section 491 of the second heat pipe 49 extends out of the housing 10 from a receiving hole 112 of the first mounting seat 11 and is fittingly received in the second receiving groove 415 of the main body 41. The evaporator section 492 of the second heat pipe 49 is in thermal contract with the electrical component 60 disposed in the housing 10. The bottom plate 50 is located on a portion 113 of the rear side 115 of the housing 10 in the receiving groove 111. The condenser section 491 of the second heat pipe 49 is disposed between the bottom plate 50 and the main body 41. A top surface 501 of the bottom plate 50 is attached to a bottom surface of the condenser section 491 of the second heat pipe 49.

The main body 41 of the heat dissipating hinge 40 is received in the receiving groove 111 of the first mounting seat 11. The two flanges 425 of the main body 41 are mounted to the top surface 118 of the first mounting seat 11. The cover 43 is located on the main body 41 and the pad 48 is disposed between the cover 43 and the main body 41. A plurality of screws 34 extend successively through the fifth mounting holes 439 of the cover 43, the sixth mounting holes 489 of the pad 48 and the third mounting holes 426 of the main body 41 to screw in the first mounting holes 114 of the first mounting seat 11, thereby fixing the heat dissipating hinge 40 on the housing 10 firmly. Accordingly, a downward pressing force is produced on the evaporator section 441 of the first heat pipe 44 and the condenser section 491 of the second heat pipe 49. The evaporator section 441 of the first heat pipe 44 contacts firmly and thermally with the main body 41. The condenser section 491 of the second heat pipe 49 contacts firmly and thermally with a bottom surface 416 of the second receiving portion 414. Furthermore, the condenser section 491 of the second heat pipe 49 is soldered on the bottom surface 416 of the second receiving portion 414 for improving thermal contract between the second heat pipe 49 and the main body 41. The pad 48 is made of a non-metallic material, for example, rubber.

During operation, the heat generated by the electrical component 60 disposed in the housing 10 is transferred from the housing 10 to the display unit 20 through the heat dissipating hinge 40. The display unit 20 is exposed to ambient air for purpose of heat dissipation. Accordingly, the display unit 20 serves as a radiator for radiating heat generated by the heat-generating electrical component 60 of the portable electronic device 100 to the ambient air. The heat dissipating hinge 40 can also act as a pivot that pivotally interconnects the housing 10 and the display unit 20.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A heat dissipating hinge for an electronic device comprising:
   a first heat pipe comprising an evaporator section and a condenser section;
   a second heat pipe comprising an evaporator section and a condenser section;
   a main body defining therein a first receiving groove and a second receiving groove, the condenser section of the second heat pipe being received in the second receiving groove and thermally connecting with the main body;
   a cover being mounted to the main body, the cover defining therein a third receiving groove, the third receiving groove and the first receiving groove cooperatively forming a receiving channel, the evaporator section of the first heat pipe being rotatably received in the receiving channel and thermally connecting with the main body, the receiving channel being filled with thermal grease; and
   a first supporting member and a second supporting member respectively received in two ends of the receiving channel, the evaporator section of the first heat pipe extending through the first supporting member and the second supporting member, the first supporting member and the second supporting member being respectively located at two ends of the evaporator section of the first heat pipe and fixed thereto, wherein the receiving channel comprises a middle portion and two end portions at two opposite ends of the middle portion, each end portion of the receiving channel has a diameter greater than that of the middle portion of the receiving channel, the first supporting member and the second supporting member are respectively received in the two end portions of the receiving channel, and the thermal grease is received in the middle portion of the receiving channel and prevented from leakage from the middle portion of the receiving channel by the first and the second supporting members.

2. The heat dissipating hinge of claim 1, further comprising a sealing member, the sealing member being received in one of the two end portions of the receiving channel and located adjacent to a free end of the evaporator section of the first heat pipe to further help preventing the leakage of the thermal grease.

3. The heat dissipating hinge of claim 1, wherein the first and second supporting members each define an annular recess in a circumference thereof for receiving the thermal grease leaked from the middle portion of the receiving channel.

4. The heat dissipating hinge of claim 1, further comprising a pad sandwiched between the cover and the evaporator section of the first heat pipe, the pad intimately engaging a half of the evaporator section of the first heat pipe.

5. The heat dissipating hinge of claim 1, wherein the main body comprises a top portion and a bottom portion, the first receiving groove is defined in the top portion, and the second receiving groove is defined in the bottom portion.

6. The heat dissipating hinge of claim 1, further comprising a bottom plate received in the second receiving groove, the condenser section of the second heat pipe being flat, the condenser section of the second heat pipe being disposed between the main body and the bottom plate.

7. A portable electronic device, comprising:
a housing receiving a heat generating electrical component therein;
a display unit;
a pivot; and
a heat dissipating hinge, the display unit being pivotably connected with the housing through the pivot and the heat dissipating hinge, the heat dissipating hinge comprising:
a first heat pipe comprising an evaporator section and a condenser section, the condenser section of the first heat pipe being thermally mounted to the display unit;
a second heat pipe comprising a condenser section and an evaporator section, the evaporator section of the second heat pipe connecting thermally to the electrical component;
a main body defining a first receiving groove and a second receiving groove, the condenser section of the second heat pipe being received in the second receiving groove and thermally connecting with the main body; and
a cover being mounted to the main body, the cover defining a third receiving groove, the third receiving groove and the first receiving groove cooperatively forming a receiving channel, the evaporator section of the first heat pipe being rotatably received in the receiving channel and thermally connecting with the main body, the condenser section of the first heat pipe being connected to the display unit, heat generated by the electrical component being transferred from the heat generating electronic component in the housing to the display unit through the heat dissipating hinge, the receiving channel being filled with thermal grease; and
a first supporting member and a second supporting member respectively received in two ends of the receiving channel, the evaporator section of the first heat pipe extending through the first supporting member and the second supporting member, the first supporting member and the second supporting member being respectively located at two ends of the evaporator section of the first heat pipe and securely connected thereto; and a sealing member, the receiving channel comprising a middle portion and two end portions at two opposite ends of the middle portion, each end portion of the receiving channel having a diameter greater than that of the middle portion of the receiving channel, the first supporting member and the second supporting member being respectively received in the two end portions of the receiving channel, and the thermal grease being filled in the middle portion of the receiving channel and prevented from leakage therefrom by the first and the second supporting members, the sealing member being received in one of the two end portions of the receiving channel and located adjacent to a free end of the evaporator section of the first heat pipe for further helping preventing the leakage of the thermal grease from the middle portion of the receiving channel.

8. The portable electronic device of claim 7, wherein the first and second supporting members each define an annular recess in a circumference thereof for receiving the thermal grease leaked from the middle portion of the receiving channel.

9. The portable electronic device of claim 7, further comprising a pad sandwiched between the cover and the evaporator section of the first heat pipe, the pad intimately engaging a part of the evaporator section of the first heat pipe whereby a depressing exerted by the cover can uniformly act on the part of the evaporator section of the first heat pipe.

10. The portable electronic device of claim 7, wherein a rear side of the housing is provided with a first mounting seat and a second mounting seat, the heat dissipating hinge is mounted to the first mounting seat, and the pivot is mounted to the second mounting seat.

* * * * *